United States Patent [19]
Raad et al.

[11] Patent Number: 5,926,410
[45] Date of Patent: Jul. 20, 1999

[54] MEMORY ARRAY ARCHITECTURE AND METHOD FOR DYNAMIC CELL PLATE SENSING

[75] Inventors: George B. Raad; Stephen L. Casper, both of Boise, Id.

[73] Assignee: Micron Technology, Inc., Boise, Id.

[21] Appl. No.: 09/159,901

[22] Filed: Sep. 24, 1998

Related U.S. Application Data

[63] Continuation of application No. 08/918,498, Aug. 22, 1997, Pat. No. 5,862,072.

[51] Int. Cl.$^6$ ........................................ G11C 5/06
[52] U.S. Cl. ...................... 365/63; 365/239; 365/230.09; 365/191
[58] Field of Search .................................. 365/239, 230, 365/189.05, 194, 63, 191, 230.09

[56] References Cited

U.S. PATENT DOCUMENTS

| | | | |
|---|---|---|---|
| 4,156,938 | 5/1979 | Proebsting et al. | 365/239 |
| 4,477,739 | 10/1984 | Probsting et al. | 365/230 |
| 5,392,251 | 2/1995 | Manning | 365/194 |
| 5,608,668 | 3/1997 | Zagar et al. | 365/149 |
| 5,625,588 | 4/1997 | Seyyedy et al. | 365/149 |
| 5,703,829 | 12/1997 | Suzuki et al. | 365/189.05 |

*Primary Examiner*—David Nelms
*Assistant Examiner*—Thong Le
*Attorney, Agent, or Firm*—Schwegman, Lundberg, Woessner & Kluth P.A.

[57] ABSTRACT

A memory array architecture is described which uses active digit lines at array edges. To maximize array area using active digit lines, a memory array architecture is employed where interior rows of memory cells intersect X columns of memory cells. Rows located along the edge of the array, however, intersect less than X columns of memory cells. Two rows of memory cells located along the edge of the array must be accessed together to form a complete row of X columns.

11 Claims, 4 Drawing Sheets

MEMORY ARRAY ARCHITECTURE AND METHOD FOR DYNAMIC CELL PLATE SENSING

This application is a continuation of U.S. Ser. No. 80/918,498 filed Aug. 22, 1997, now U.S. Pat. No. 5,862,072.

TECHNICAL FIELD OF THE INVENTION

The present invention relates generally to integrated circuit memories and in particular the present invention relates to a memory array architecture.

BACKGROUND OF THE INVENTION

A modern DRAM memory cell consists of one MOS access transistor and one storage capacitor referred to as a one-transistor one-capacitor (1T1C) cell. The memory cell access transistor operates as a switch, interposed between the memory cell capacitor and a digit line. The memory cell is capable of holding a single piece of binary information, as stored electric charge in the cell capacitor. Given a bias voltage of Vcc/2 on the capacitor's common node, a logic one level is represented by +Vcc/2 volts across the capacitor and a logic zero is represented by −Vcc/2 volts across the capacitor.

The digit line consists of a conductive line connected to a multitude of memory cell transistors. Generally, either metal or polysilicon forms the conductive line. Due to the large quantity of attached memory cells, its physical length, and proximity to other features, the digit line is very capacitive.

The memory cell transistor's gate terminal connects to a word line. The word line, which connects to a multitude of memory cells, consists of an extended segment of the same polysilicon used to form the transistor's gate. The word line is physically orthogonal to the digit line.

A pair of digit lines are typically fabricated as two adjacent digit lines. The digit lines are initially equilibrated at Vcc/2 volts, and all word lines are initially at zero volts, which turns off the memory cell access transistors. To read a memory cell, its word line transitions to a voltage that is at least one transistor $V_{th}$ above Vcc. This elevated word line voltage level is referred to as Vccp or Vpp. When the word line voltage exceeds one $V_{th}$ above the digit line equilibrate voltage (Vcc/2) and the memory cell access transistor turns on, the memory cell capacitor begins to discharge onto a digit line. Essentially, reading or accessing a memory cell results in charge sharing between the memory cell capacitor and the digit line capacitance. This sharing of charge causes the digit line voltage to either increase for a stored logic one or decrease for a stored logic zero. Ideally, the access will only modify the active digit line, leaving its complement digit line unaltered. Thus, differential voltage develops between the two digit lines.

After the cell access is complete, a sensing operation is performed. The reason for forming a digit line pair is to allow for the use of a differential sense amplifier circuit. The sense amplifier typically consists of a cross-coupled PMOS transistor pair and a cross-coupled NMOS transistor pair. As discussed in the preceding paragraph, a signal voltage develops between the digit line pair when the memory cell access occurs. While one digit line contains charge from the cell access, the other digit line serves as a reference for the sensing operation. The sense amplifier firing generally occurs sequentially rather than concurrently. The N-sense-amp fires first and the P-sense-amp second.

In another memory architecture, a common plate of the array of memory cell capacitors is used as a reference for the sense amplifier circuitry. In this architecture, the common plate is held at a predetermined voltage during operation.

For the reasons stated above, and for other reasons stated below which will become apparent to those skilled in the art upon reading and understanding the present specification, there is a need in the art for a different referencing scheme for low voltage memories. Further, there is need for a memory array architecture which maximizes die area when implementing the different referencing scheme.

SUMMARY OF THE INVENTION

The above mentioned problems with memory devices and other problems are addressed by the present invention and which will be understood by reading and studying the following specification. A memory device is described which has an array architecture that maximizes the array area with active digit lines.

In one embodiment, a method of accessing a memory device is described. The method comprises receiving a first memory row address of a memory array, activating a first word line signal to couple X memory cells to X active digit lines, receiving a second memory row address of the memory array, and activating second and third word line signals at substantially the same time to each couple X/2 memory cells to X/2 active digit lines.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
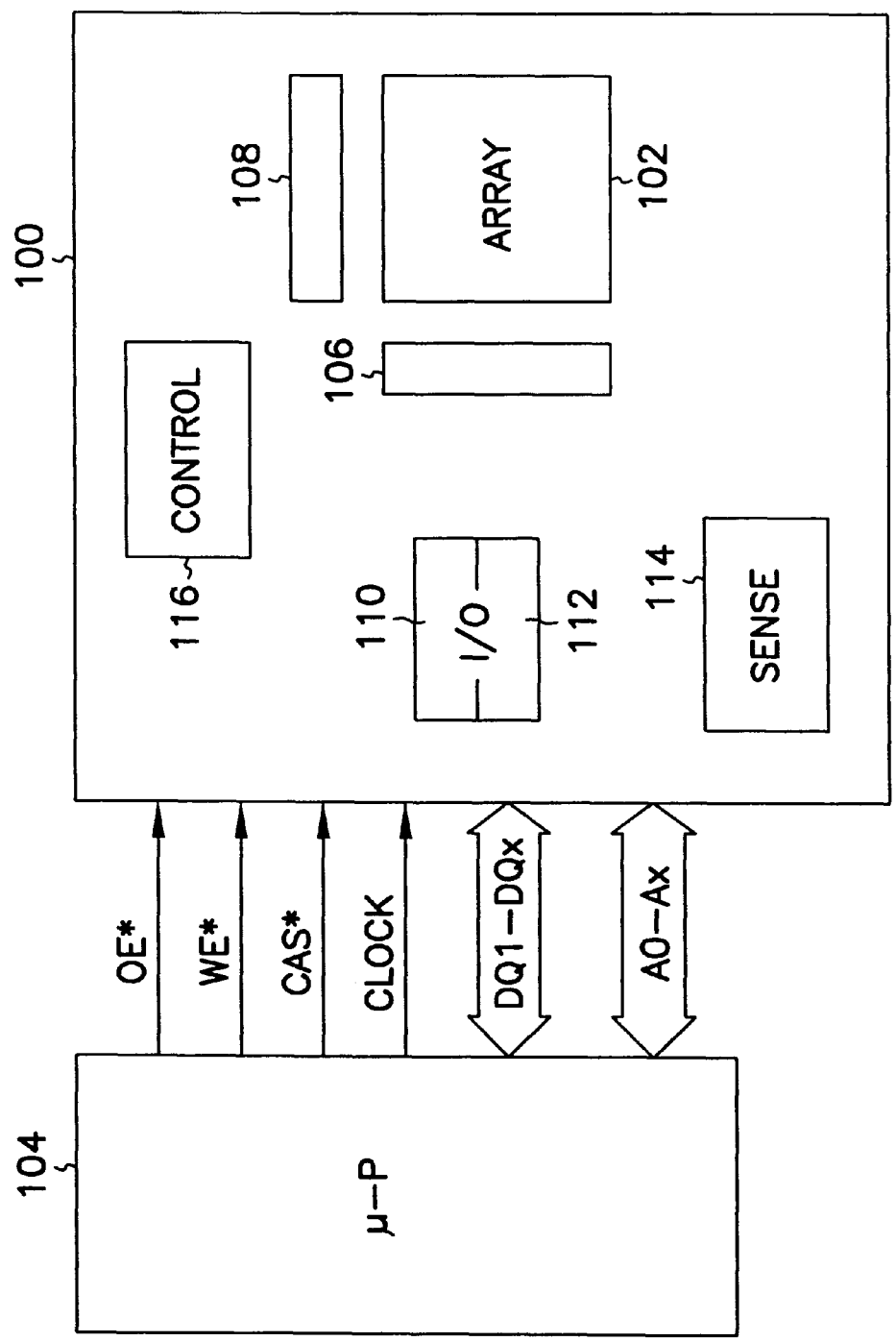
FIG. 1 is a block diagram of a memory device of the present invention.

A DRAM 100 is described in reference to FIG. 1 as having a memory array 102 and associated circuitry for reading from and writing to the memory array. The memory array is arranged in an x-y grid, or rows and columns of memory cells. The DRAM array can be accessed by a microprocessor 104, memory controller, a chip set, or other external system through input/output connections including address lines A0–Ax. Row decoder 106 decodes a row address from an address signal provided on A0–Ax, and addresses the corresponding row of the DRAM array. Likewise, column decoder 108 decodes a column address from an address signal provided on A0–Ax, and addresses the corresponding column of the DRAM array. Data stored in the DRAM array can be transferred to outputs DQ1–DQx through the data output buffer 110. Likewise, data input buffer 112 is used to receive data from DQ1–DQx and transfer the data to the DRAM array. Sense amplifier circuitry 114 is provided to sense and amplify data stored on the individual memory cells of the DRAM array. Control circuitry 116 is provided to monitor the memory circuit inputs and control reading and writing operations.

The input and output connections of the DRAM 100 used to communicate with the microprocessor 104 are described as follows. Output enable (OE*) enables the output buffer 110 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines A0–Ax are used to identify a row and column address. DRAM data input/output lines DQ1–DQx provide data input and output for the DRAM. An optional clock signal can be provided by the microprocessor as described below for operating the memory circuit in a synchronous mode.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

Figure 2:
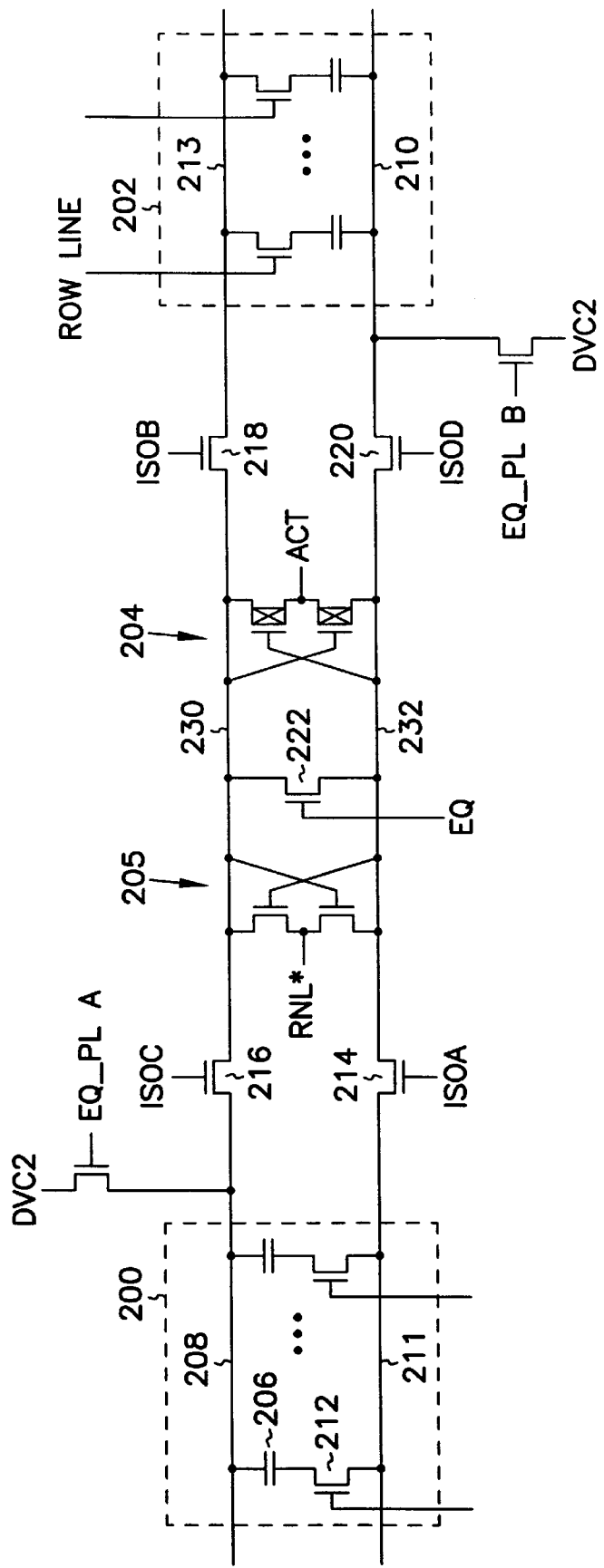
FIG. 2 is a portion of an array of the memory of FIG. 1.

FIG. 2 is a general schematic diagram of a dynamic digit line memory array layout for the memory array of FIG. 1. The memory array has two sub-arrays 200 and 202 which share a common p-sense amplifier circuit 204, and an n-sense amplifier 205. One capacitive plate of memory cells 206 is coupled to a common plate line 208 or 210, depending upon which sub-array the memory cell is located in. The other capacitive plate of the memory cells are selectively coupled to a digit line 211 or 213 through an access transistor 212. The digit lines, defining an array column, and cell plate lines are coupled to the sense amplifier circuitry through isolation transistors 214, 216, 218 and 220. An equilibration transistor 222 is coupled between the sensing nodes of the sense amplifier circuit.

As described above in the background, a plate of the memory cells can be fabricated as a common plate for the entire array. This common plate is typically maintained at a predetermined voltage level, preferably Vcc/2. It will be recognized by those skilled in the art that if the common plate is used as a reference for a sense amplifier, the reference node of the sense amplifier remains stable during sensing operations prior to activating the sense amplifier. In a dynamic cell plate scheme the cell plates of the memory cells are fabricated in lines, or strips corresponding to the digit lines. When a memory cell is coupled to the digit line for reading data, the corresponding cell plate line is coupled in an opposite direction. The sense amplifier, therefore, will have a larger differential voltage to sense, as described in greater detail below. Thus, lower voltage memory devices can be realized.

Figure 3:
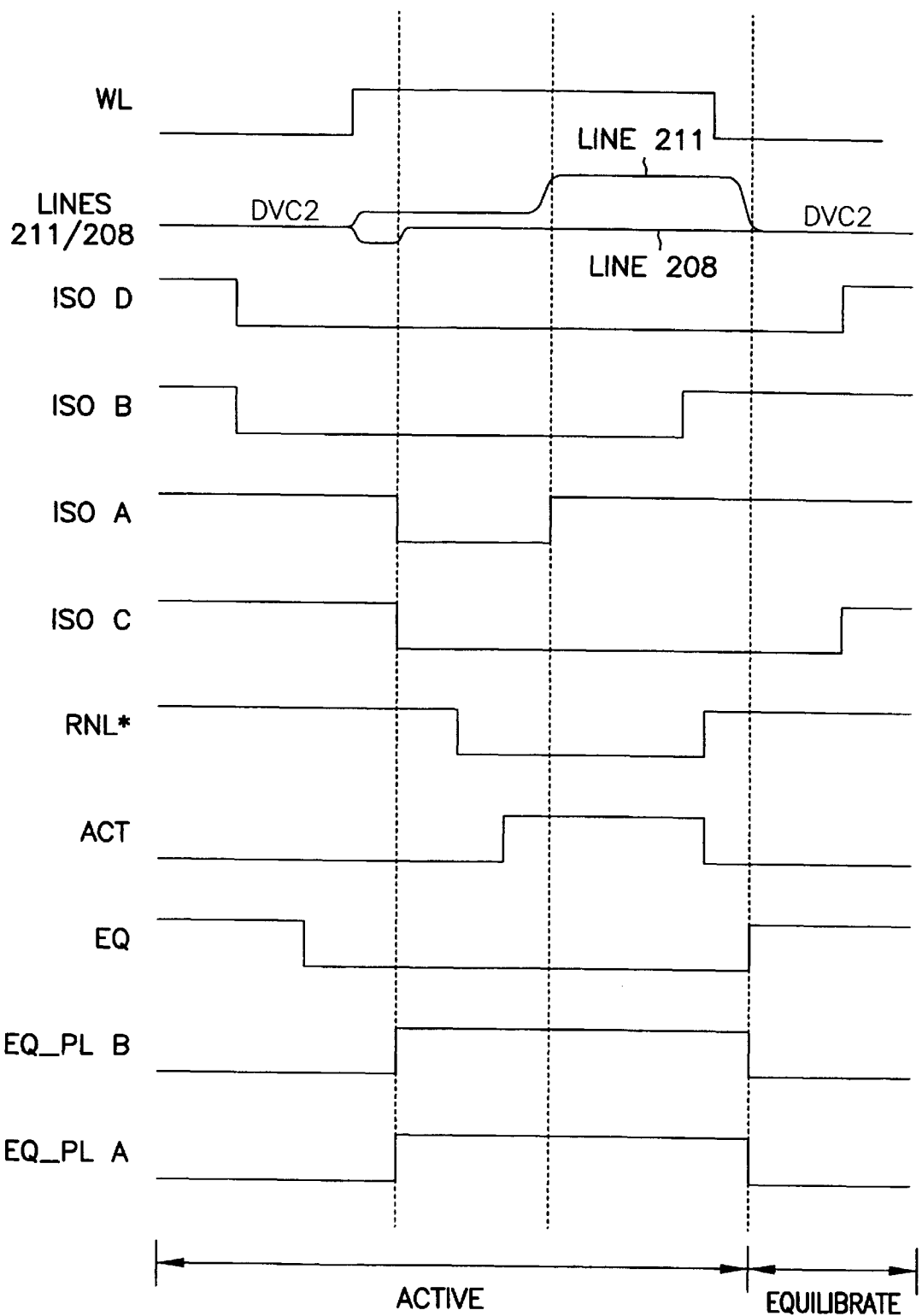
FIG. 3 is a diagram of signals during operation of the column of FIG. 2.

Referring to FIG. 3, the basic operation of reading a memory cell is explained. It will be recognized by those skilled in the art that the digit lines are equilibrated to a common voltage level prior to accessing a memory cell. Any known technique can be employed, but it is preferred that digit lines 208 and 210 be coupled to opposite nodes 230 and 232 of the sense amplifier such that they are at opposite voltage levels. The digit lines are then coupled together via transistor 222 when the sense amplifier is turned off.

To read a memory cell, isolation transistors 214 and 216 are first activated by isolation signal ISOA and ISOC to couple the digit line and the common plate to sense amplifier nodes 230 and 232. A word line signal, or row line which is parallel to the digit lines, transitions to a high state to activate access transistor 212. Assuming that the memory is storing a positive charge, a digit line voltage is increased as a result of the charge sharing between the memory cell and the digit line, as illustrated in the signal of node 230 of the sense amplifier in FIG. 3. Because the common plate 211 is not formed as a large array conductor, but is limited to corresponding to the digit line, the voltage on node 232 is coupled lower. A larger differential voltage, therefore, is experienced by the sense amplifier than would be experienced if the cell plate voltage did not change during the read operation. This architecture is referred to as a dynamic cell plate design.

Figure 4:
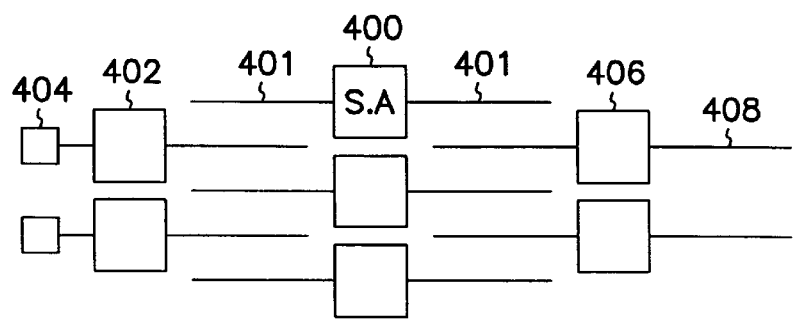
FIG. 4 is a typical memory array.

Referring to FIG. 4, a typical memory array is illustrated having an open digit line design. The sense amplifiers 400 (illustrated as blocks) located in the center of the array have two active digit lines 401 coupled thereto. Sense amplifiers 402 and 406 located on the edge of the array can be coupled to either a simulation circuit 404 which simulates the electrical characteristics of anactive digit line or an inactive dummy digit line 408. These references are provided primarily for equilibration operations of the digit lines and sense amplifier nodes. These solutions do not necessarily maximize the use of the memory array area.

Figure 5:
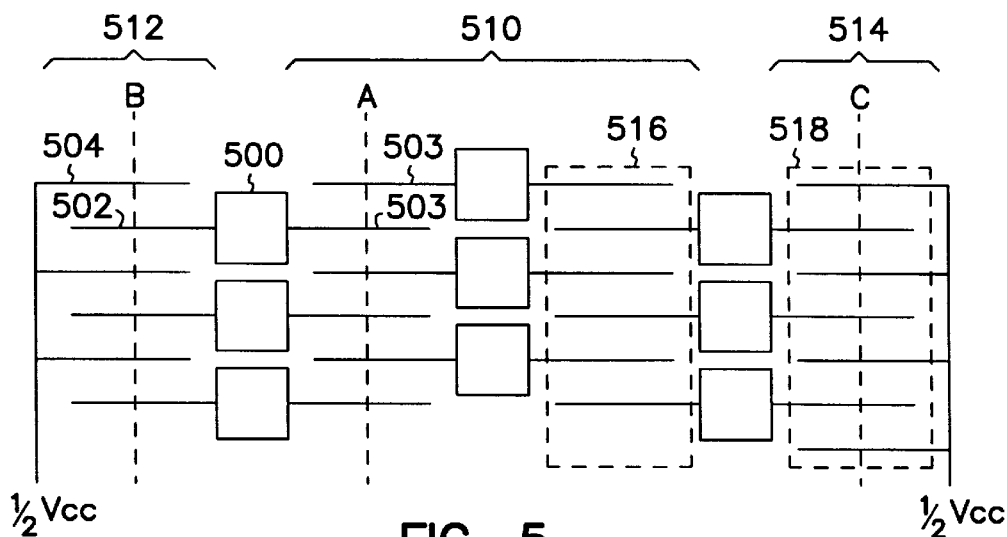
FIG. 5 is a plan view of one embodiment of a memory array of FIG. 1.

FIG. 5 illustrates a memory array architecture according to one embodiment of the present invention where sense amplifiers 500 located near the edge of the array regions 512 and 514, are coupled to two active digit lines 502 and 503. It will be appreciated by those skilled in the art that when a row of memory cells located away from the array edge, in region 510, is activated, more memory cells are accessed. That is, if a word line is activated along line A of FIG. 5, six memory cells would be coupled to the bisected six active digit lines 503. If a word line is activated along line B of FIG. 5, only three memory cells would be coupled to the bisected three active digit lines 502. Thus, only half of the needed columns are available along the array edges.

Addressing and accessing processes are employed to access memory array rows located in regions 512 and 514 simultaneously and couple the corresponding digit lines to external input/output connections. As such, the memory can be viewed conceptually as a cylinder where the outside digit lines on opposite array edges are combined to form a complete row. Thus, more array area can be occupied by active digit lines. The array 102 is fabricated, in a plan view, into sub-arrays 516 and 518 which are separated by sense amplifier circuitry. The sub-array 516 has twice as many active digit lines as the sub-array 518.

Dummy digit lines 504 can be provided between the active digit lines located along the array edge. These dummy digit lines can be coupled to an equilibrate reference voltage, such as ½ Vcc. This technique allows the active digit lines 502 to operate like the interior active digit lines 503 by having adjacent "digit lines" which are charged to an equilibrate voltage.

Figure 6:
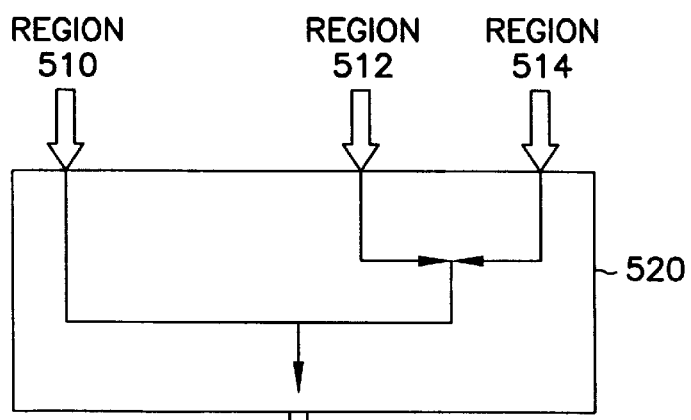
FIG. 6 is a diagram of data routing circuitry.

FIG. 6 illustrates data routing circuitry 520 which routes data from columns of the array 102 to external data lines DQ–DQX. When a row in region 510 is accessed the intersected X columns, or digit lines, are coupled to the DQ lines. When a row is accessed in regions 512 and 514, the X/2 columns from each region are coupled to the DQ lines to access a complete row of X columns. The routing circuitry can be any known circuit, including a multiplexer circuit.

Conclusion

A memory array architecture has been described which uses active digit lines at array edges. To maximize array area using active digit lines, a memory array architecture is employed where interior rows of memory cells intersect X columns of memory cells. Rows located along the edge of the array, however, intersect X/2 columns of memory cells. Two rows of memory cell located along the edge of the array must be accessed together to form a complete row of X columns.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of accessing a memory device, the method comprising:
   receiving a first memory row address of a memory array;
   activating a first word line signal to couple X memory cells to X active digit lines;
   receiving a second memory row address of the memory array; and
   activating second and third word line signals at substantially the same time to each couple X/2 memory cells to X/2 active digit lines.

2. The method of claim 1 wherein the X/2 digit lines are located along a periphery of the memory array.

3. The method of claim 1 wherein the memory device includes dynamic digit line sensing such that memory cells are fabricated as capacitors having one conductive plate coupled to an access transistor and a second conductive plate fabricated as a common plate corresponding to a digit line, such that only memory cells which are coupled to the digit line share a common plate.

4. The method of claim 1 wherein memory device is a dynamic random access memory.

5. The method of claim 1 further including coupling X memory cells to X input/output connections.

6. A method of accessing a memory device, the method comprising:
   receiving a first memory row address of a memory array;
   activating a first word line signal to couple X memory cells to X digit lines;
   coupling first X digit lines to input/output connections;
   receiving a second memory row address of the memory array;
   activating second and third word line signals at substantially the same time to each couple X/2 memory cells to X/2 digit lines; and
   coupling second X digit lines to input/output connections, where the second X digit lines comprise the two X/2 digit lines.

7. A method of operating a processing system comprising a memory coupled to a processor, the method comprising:
   transmitting a first read request from the processor to the memory, the first read request indicating a first memory row address which contains requested data;
   accessing X memory cells having the first memory row address using a single word line signal;
   coupling the X memory cells to input/output connections via X digit lines;
   transmitting a second read request from the processor to the memory, the second read request indicating a second memory row address which contains requested data;
   accessing X memory cells having the first memory row address using two simultaneously activated word line signals, of the two word line signals are coupled to X/2 memory cells; and
   coupling the two X/2 memory cells to the input/output connections via X digit lines.

8. A method of accessing a memory device having a memory array, the method comprising:
   accessing a first region of the memory array, the first region comprises memory cells arranged in rows, the rows are defined by word lines which intersect X active digit line columns;
   coupling data from the X memory cells of the first region to input/output connections;
   accessing a second region of the memory array, the second region comprises memory cells arranged in rows, the rows are defined by word lines which intersect X/2 active digit line columns;
   accessing a third region of the memory array, the third region comprises memory cells arranged in rows, the rows are defined by word lines which intersect X/2 active digit line columns; and
   coupling data from X memory cells of both the second and third regions to input/output connections.

9. The method of claim 8 wherein either the first region or the second and third regions are coupled to the input/output connections using a multiplex circuit.

10. The method of claim 8 wherein the memory device is a dynamic random access memory (DRAM).

11. The method of claim 8 wherein the memory device is accessed by either a microprocessor, memory controller or a chip set.

* * * * *